United States Patent [19]

Lien

[11] 4,412,502

[45] Nov. 1, 1983

[54] APPARATUS FOR THE ELIMINATION OF EDGE GROWTH IN LIQUID PHASE EPITAXY

[75] Inventor: Suei-Yuen P. Lien, West Windsor Township, Mercer County, N.J.

[73] Assignee: Western Electric Co., Inc., New York, N.Y.

[21] Appl. No.: 467,402

[22] Filed: Feb. 17, 1983

Related U.S. Application Data

[62] Division of Ser. No. 277,412, Jun. 25, 1981, Pat. No. 4,390,379.

[51] Int. Cl.³ .................... B05C 3/109; H01L 21/208
[52] U.S. Cl. .................................... 118/412; 118/415; 118/421
[58] Field of Search ............... 118/412, 415, 421; 156/621, 622, 624; 148/171, 172

[56] References Cited

U.S. PATENT DOCUMENTS

| | | | |
|---|---|---|---|
| 3,051,555 | 8/1962 | Rummel | 23/223.5 |
| 3,565,702 | 2/1971 | Nelson | 148/172 |
| 3,589,336 | 6/1971 | Bergh | 118/421 |
| 3,697,330 | 10/1972 | Minden et al. | 148/1.5 |
| 3,767,481 | 10/1973 | Ettenberg et al. | 148/171 |
| 3,821,039 | 6/1974 | Ettenberg | 148/171 |
| 3,854,447 | 12/1974 | Kobayashi | 118/421 |
| 3,859,148 | 1/1975 | Dawson et al. | 148/172 |
| 3,890,194 | 6/1975 | Ettenberg | 156/622 |
| 3,933,538 | 1/1976 | Akai et al. | 148/171 |
| 3,950,195 | 4/1976 | Rode et al. | 148/172 X |
| 4,032,370 | 6/1977 | Matare | 148/171 |
| 4,047,986 | 9/1977 | Hanoka | 148/171 |
| 4,160,682 | 7/1979 | Esseluan | 148/171 |
| 4,261,770 | 4/1981 | Splittgerber et al. | 148/172 |

Primary Examiner—John P. McIntosh
Attorney, Agent, or Firm—J. F. Spivak

[57] ABSTRACT

An apparatus for substantially eliminating excessive edge growth in liquid phase epitaxy utilizing a substrate carrier 11 and a source material carrier 13 slidable over the substrate carrier 11 including a well 24 around a recess 14 in the substrate carrier 11 wherein the substrate 16 is held. The well 24 contains a material therein which reduces the heat loss from the edges of the substrate 16 held in the recess 14 thereby reducing excessive epitaxial growth around the edges of the substrate 16.

6 Claims, 6 Drawing Figures

APPARATUS FOR THE ELIMINATION OF EDGE GROWTH IN LIQUID PHASE EPITAXY

This is a division of application Ser. No. 277,412 filed June 25, 1981, now U.S. Pat. No. 4,390,379.

TECHNICAL FIELD

The present invention relates to methods and apparatus for growing one or more layers of semiconductor material on a substrate by liquid phase epitaxy. More particularly, the present invention relates to such methods and apparatus wherein deposition solutions of the semiconductor material in a solvent are contacted with the substrate by means of a slide apparatus.

BACKGROUND OF THE INVENTION

A technique which is common for use in making certain types of semiconductor devices, particularly semiconductor devices made of the Group III-V semiconductor materials and their alloys, such as light emitting devices and electron transfer devices is known as liquid phase epitaxy. Liquid phase epitaxy is a method for depositing an epitaxial layer of single crystalline semiconductor material on a substrate (generally a crystalline substrate) wherein a surface of the substrate is brought into contact with a solution of a semiconductor material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxially layers can be deposited one on top of the other to form a semiconductor device of a desired construction including, for example, a semiconductor device having a p-n junction between adjacent epitaxial layers of opposite conductivity type.

Liquid phase epitaxial growth has been accomplished by various techniques including the method of slowly cooling the liquid phase which is in contact with a solid substrate as well as the method of employing a temperature gradient through the liquid phase. Further, various apparatus has been employed depending upon the method used. Where slow cooling has been used, the substrate has been contacted with the liquid phase by means of dipping, tipping, rotation or inversion of a substrate held in a container so as to contact the liquid and by means of an apparatus employing a slide wherein the liquid and substrate are contacted by sliding one over the other.

U.S. Pat. No. 3,565,702 to H. Nelson, issued Feb. 23, 1971 describes a method and apparatus for depositing one or more epitaxial layers by liquid phase epitaxy employing an apparatus which includes a furnace boat of a refractory material having a plurality of spaced wells in its top surface and a slide of a refractory material movable in a passage which extends across the bottoms of the wells. In the use of this apparatus, a semiconductor solution is provided in a well and the substrate is placed in a recess in the side. The slide is then moved to bring the substrate into the bottom of the well so that the surface of the substrate is brought into contact with the solution. Upon cooling, epitaxial layers are deposited on the substrate and the slide is then moved to carry the substrate out of the well. A plurality of epitaxial layers may be deposited on the substrate by providing separate solutions and separate wells and carrying the substrate by way of the slide to each of the wells in succession. Other slide type apparatus have also being shown in the prior art all of which are included herein by reference. These prior art references are as follows: U.S. Pat. Nos. 3,767,481; 3,890,194; 3,933,538; 3,821,039; and 3,854,447.

In spite of the excellent crystalline characteristics of wafers grown in such slide apparatus by means of liquid phase epitaxy, certain problems still exist with use of such apparatus. In particular, epitaxially grown semiconductor films made by using the equilibrium cooling technique and prior art slide type apparatus results in the formation of excess edge growth. This excess edge growth has been explained as due to a greater heat loss from around the edges of the substrate well creating a temperature along the substrate in the area of the well walls. When using the sliding boat type of apparatus, this edge growth not only reduces the usable area of a wafer due to the nouniformity of the thickness of the epitaxial layer across the wafer, but it also interferes with the sliding mechanism of the apparatus. Further, as the substrate is moved from one melt to the next, excess edge growth can break off and be dragged over the grown layer producing scratches. To minimize this effect, a clearance between the substrate and graphite may be employed. However, such a clearance, while eliminating or reducing a problem of scratches, often results in a measurable amount of material being carried between successive melt. I have now discovered a method of altering the thermal properties of a melt well so as to substantially eliminate or reduce the excess edge growth.

SUMMARY OF THE INVENTION

An apparatus for growing a single crystalline semiconductor layer on a substrate by means of liquid phase epitaxy comprises a substrate carrier having a recess in which the substrate is held, and a semiconductor growth solution source carrier arranged to be slidable over the surface of the substrate carrier and having a well therein for containing semiconductor solution used for growing the epitaxial layer. The source well extends or communicates through the source carrier so as to be opened to the surface of the substrate carrier. The substrate carrier is provided with a thermal well extending peripherally around and adjacent the substrate recess. The thermal well contains a material for reducing the amount of heat loss from around the edge areas of the recess in the substrate carrier thereby providing a more uniform heat distribution over the substrate which lies in the recess. Optionally, an additional thermal well may be provided around the semiconductor source well so as to provide a more uniform temperature of the molten semiconductor source material. The addition of the thermal wells to the prior art type slidable liquid phase epitaxial growth apparatus substantially reduces or eliminates the edge growth problem.

DETAILED DESCRIPTION

Figure 1:
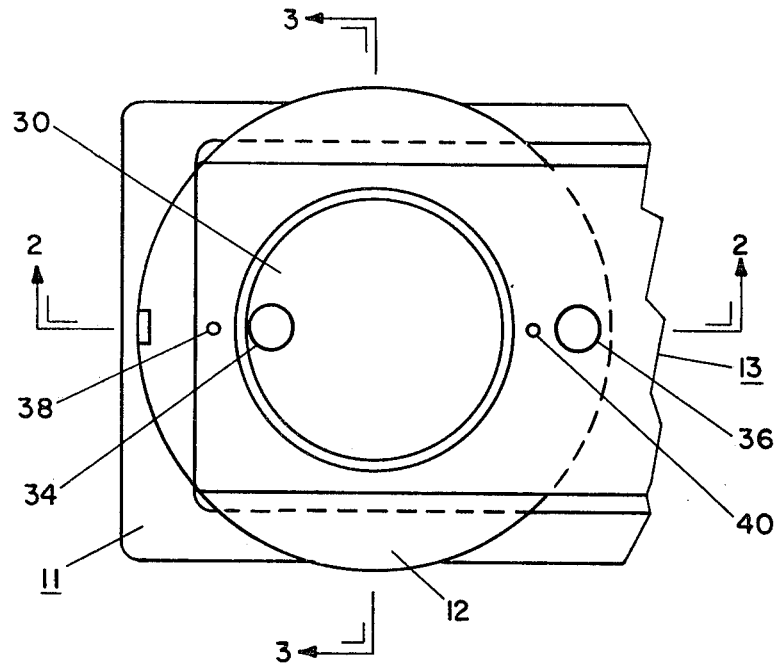
FIG. 1 is a top elevational view of a portion of an apparatus made in accordance with the invention and useful for growing epitaxial layers and multiple substrates simultaneously.
Figure 2:
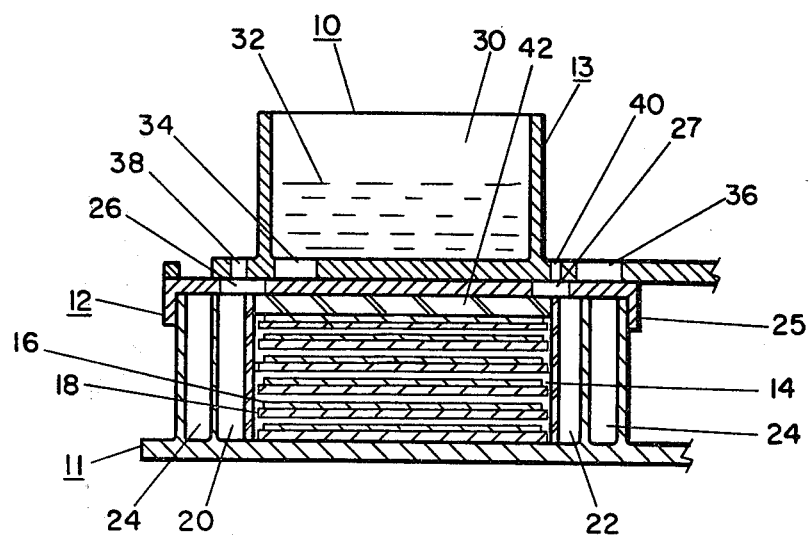
FIG. 2 is a side cross-sectional view taken along the 2—2 section line of FIG. 1.
Figure 3:
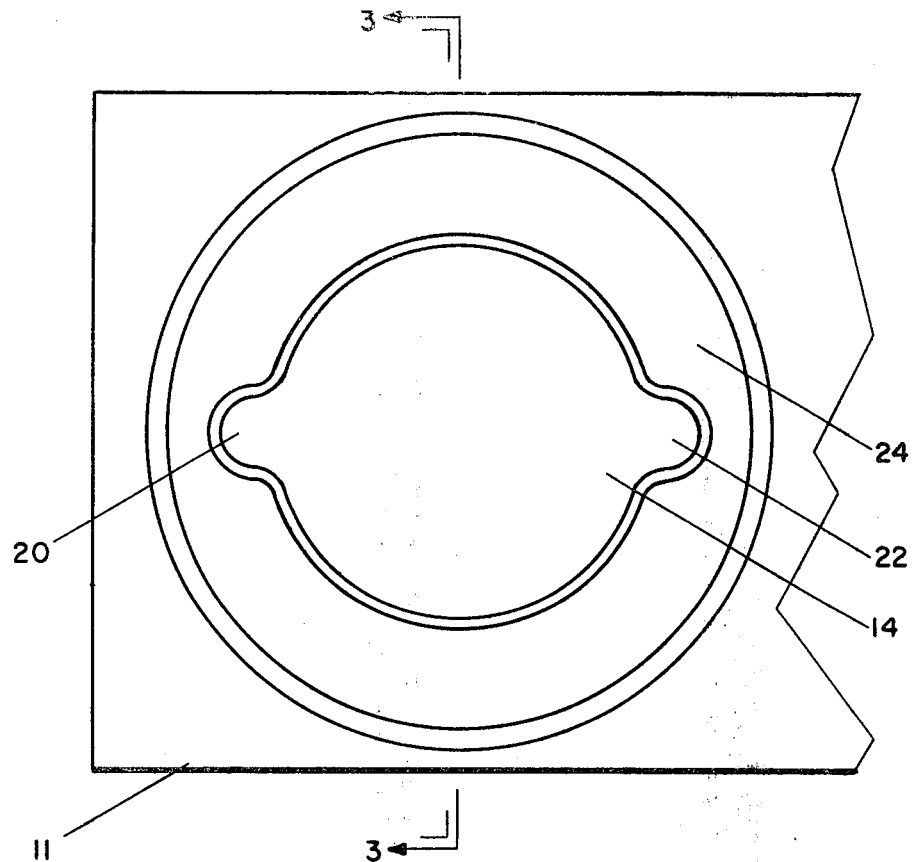
FIG. 3 is a top elevational view of the substrate carrier for the apparatus described in FIG. 1.
Figure 4:
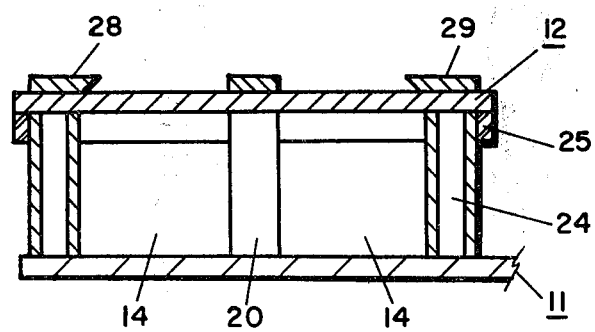
FIG. 4 is a side cross-sectional view of a portion of the apparatus of FIG. 1 taken along the 3—3 section line.

Referring to FIGS. 1 through 4, an embodiment of a novel apparatus 10 in accordance with the present invention is shown. The apparatus 10 comprises three major components, namely, a substrate carrier 11, a substrate cover 12 and a source carrier or container 13. The various components are made of an inert refractory material, such as graphite or quartz.

The substrate carrier 11 comprises one or more deep cylindrical recesses 14 for carrying one or more circular substrates 16 therein. Where multiple substrates 16 are set within the recess 14, each successive substrate is separated by spaced substrate support surfaces 18 hereinafter referred to as the substrate holder. The substrate holder 18 is formed so as to snugly fit within the recess 14 and may be provided with means (not shown) to prevent movement of the substrate 16. Adjacent to the deep recess 14 and on opposite sides of the recess is a semiconductor source inlet channel 20 and an outlet channel 22. The channels 20 and 22 extend from the upper surface of the substrate carrier 11 to a depth equivalent to the bottom of the recess 14 and communicates with the recess 14. A thermal well 24 is provided in the substrate carrier 11. This thermal well 24 extends peripherally around and is immediately adjacent to the substrate recess 14. In operation of the device, the thermal well 24 contains a material which reduces the heat loss from the outer edge of the recess 14 and hence from the outer edge of the substrate 16 and growing epitaxial layer. Suitable thermal materials for use in the thermal well are, for example, molten metals or compounds. Preferably, such molten metals or compounds are inert with respect to the epitaxial layer being grown. For example, in the production of gallium phosphide, gallium arsenide, or gallium arsenide phosphide epitaxial layers, gallium is a suitable metal which is molten at the growth temperature and would reduce heat loss. It is not necessary that the material provided in the thermal well 24 be a metal or molten. For example, high temperature insulating materials such as powdered alumina, or asbestos fiber may also be suitable. The depth of the thermal well 24 within the substrate carrier 11 should preferably be at least equivalent to the depth of the recess 14.

The substrate cover 12 overlies the recess 14, the inlet and outlet channels 20 and 22 and the thermal well 24 of the substrate carrier 11. The cover 12 is provided with a lip 25 around its outer periphery which seats around the outer edge of the thermal well 24. The substrate cover 12 is also provided with spaced through holes 26 and 27 which are in registration with the channel 20 and 22 of the substrate carrier 11. The top of the cover 12 is formed with a pair of oppositely facing spaced guides 28 and 29 for guiding the movement of the source material container 13 which slides over the cover 12 between the guides 28 and 29.

As stated, the apparatus 10 also includes a semiconductor material source container 13 which is slidable over the surface of the substrate cover 12. The source container 13, as shown, is provided with a semiconductor source material well 30 for containing semiconductor solution 32 used for the liquid phase epitaxial growth. The source well 30 extends from the surface of the source container 13 to just above the bottom of the source container 13 and an exit port 34 is provided through the bottom of the source well 30 so that when in alignment with the cover hole 26, growth material 32 flows out of the exit port 34 and through hole 26 of the cover 12 and into the inlet channel 20 of the substrate recess 14 so as to cover the substrate 16. The source container 13 is also provided with a through hole vent 36 outside the surface well 30 and spaced from the exit port 34 so as to align with the cover hole 27 and carrier vent channel 22 when the exit port 34 is in alignment with cover hole 26 and carrier inlet channel 20. In this manner as source material enters the inlet channel 20, the atmosphere that was covering the substrates 16 and filling the various channels and spaces of the recess 14 can be vented out through the exit channel 22 and the hole vent 36. A pair of small spaced vents 38 and 40 are also provided in the source container for allowing purging of the substrate carrier recess 14 prior to operation.

It should be understood that while only one substrate carrier recess 14 and only one corresponding semiconductor source well 30 are shown in the FIGS., the apparatus may actually be provided with a plurality of such recesses and corresponding wells so that many more substrates can have single crystal liquid phase epitaxial layers simultaneously grown thereon.

In operation of the novel device, previously cleaned and prepared substrates 16 are provided in the substrate holder 18 and stacked within the recess 14. The thermal well 24 is filled with the heat loss stabilizing material, such as gallium, and the source container 13 is slid into position over the substrate carrier 11 such that the exit port 34 of the source well 30 is out of alignment with the cover hole 26 and inlet channel 20 of the substrate carrier 11. The source container well 30 is filled with the semiconductor source material 32 and the apparatus is then ready to be put in the furnace where an inert atmosphere is generally provided. The furnace (not shown) is flushed with the inert atmosphere and then brought up to the desired temperature to cause the source material 32 to melt so as to form a uniform solution. The apparatus 10 with the source material 32 is allowed to come to thermal equilibrium at the desired temperature, which temperature depends upon the particular material to grow by liquid phase epitaxy and then the source container 13 is slid over the substrate cover 11 so as to align the exit port 34 of the source material well 30 with the cover hole 26 and inlet channel 20 of the recess 14 in the substrate carrier 12. It should be noted that a thin cover plate 42 is preferably positioned over the top most substrate holder 18 in the recess 14. Once the source container 13 is in place, the molten source material flows over the substrates 16 and the substrates 16 are programmed through a predetermined temperature cycle so as to form the desired epitaxial layer. The particular cycle depends upon the specific composition of the epitaxial layer to be grown. The particular temperatures needed for the various semiconductor compounds grown by liquid phase epitaxy are generally well known in the art and need to be repeated herein.

After the formation of the desired epitaxially grown layers, the substrates may be removed from the carrier for further processing.

Figure 5:
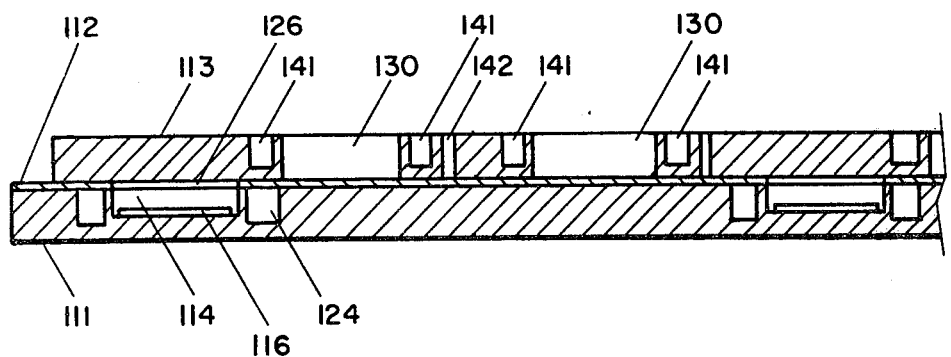
FIG. 5 is a side cross-sectional view of the second embodiment of the invention which is suitable for either simultaneous formation of single crystal liquid phase epitaxially grown layers on multiple substrates or the successive growth of different epitaxially growth layers on one or more substrates.
Figure 6:
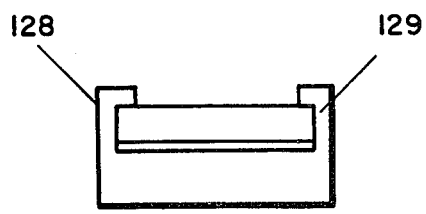
FIG. 6 is a front elevational view of the apparatus shown in FIG. 5.

Referring to FIGS. 5 and 6 there is shown a second embodiment of the invention which is particularly useful for the formation of successively grown epitaxial layers on a substrate. In accordance with this embodiment, an apparatus is provided which comprises a substrate carrier 111, a thin cover plate 112 and a source material container 113. The substrate carrier 111 is an elongated rectangular member having one or more spaced substrate recesses 114 in the top surface thereof. The substrate recess 114 is generally circular so as to accommodate a circular substrate 116 but may be of any shape provided it accommodates the substrate used. The diameter of the recess 114 is only slightly larger than that of the substrate 116 to be used. Surrounding each substrate recess 114 is a moat or well 124 for containing a material for reducing the heat loss from the edges of the recess 114. The sides 128 and 129 of the substrate carrier 111 extend upwardly and have an upper lip or flange so as to provide a guide for the source container 113 to slide within. The cover 112 is a thin member which lies over the central portion of the substrate carrier 111 and is provided with a plurality of holes 126 each hole 126 registering with one of the substrate recesses 114 while covering the thermal wells 124. The source container 113 is formed as an elongated rectangular member so as to slidably fit within the 128 and 129 guides formed by the substrate carrier 111. The source container 113 is provided with a plurality of wells 130 in the form of spaced through-holes the dimension of which is equal to or somewhat less than the diameter of the recess 114 in the substrate carrier 111. A thermal well or moat 141 may also be provided around each of the through-holes 130 of the source container 113. Where the substrate carrier 111 has more than one substrate recess, the recesses are spaced far enough apart so as to allow for the positioning of a source well for each successive layer to be grown adjacent to the space between the recesses. In this manner the source container 113 can be slid over the substrate carrier 111 so as to first position a first composition to be epitaxially grown, for example, a p-type gallium arsenide layer over a given substrate and after growth of that layer the slide can be advanced further so as to then grow an n-type layer or other different layer over the previously grown layer, successively. Optionally, the source container 113 may also be provided with a plurality of capillary vents 142 for removing excess material as it is slid over the recess 114.

It should be understood, that the growing of successive layers or the simultaneous growth on multiple substrates is optional and basically, any of the previously known slide type apparatus used in liquid phase epitaxial growth, when adapted with a thermal well adjacent to a substrate holder area as taught herein is included within the scope of this invention.

What is claimed is:

1. An apparatus useful for growing single crystal semiconductor layers by liquid phase epitaxy comprises a substrate carrier having at least one recess therein for holding one or more substrates and a growth solution source carrier which is slidable over the substrate carrier, said source carrier having at least one hole therein for containing molten growth material and including a well around the periphery of the recess for containing a material capable of reducing the heat loss from the edges of the recess.

2. The apparatus recited in claim 1 and formed from a relatively inert refractory material.

3. The apparatus recited in claim 2 wherein said refractory is silica or graphite.

4. The apparatus recited in claim 1 wherein said well is at least as deep as said recess.

5. The apparatus recited in claim 1 wherein said well is filled with a thermally insulating material.

6. The apparatus recited in claim 1 wherein said well is filled with a metallic component of the semiconductor layer to be formed.

* * * * *